US006566883B1

(12) United States Patent
Vonderhaar et al.

(10) Patent No.: US 6,566,883 B1
(45) Date of Patent: May 20, 2003

(54) ELECTRONIC BATTERY TESTER

(75) Inventors: J. David Vonderhaar, Bolingbrook; Kevin I. Bertness, Batavia, both of IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/703,270

(22) Filed: Oct. 31, 2000

Related U.S. Application Data

(60) Provisional application No. 60/163,013, filed on Nov. 1, 1999.

(51) Int. Cl.[7] ............................................. G01N 27/416
(52) U.S. Cl. ...................................... 324/426; 320/134
(58) Field of Search ................................ 324/426, 425, 324/430, 427; 320/134, 136, 137, 160, 162, 132

(56) References Cited

U.S. PATENT DOCUMENTS

| | | | |
|---|---|---|---|
| 2,514,745 A | 7/1950 | Dalzell | 324/115 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 204/404 |
| 3,676,770 A | 7/1972 | Sharaf et al. | 324/430 |
| 3,729,989 A | 5/1973 | Little | 324/162 |
| 3,753,094 A | 8/1973 | Furuishi et al. | 324/430 |
| 3,808,522 A | 4/1974 | Sharaf | 324/430 |
| 3,811,089 A | 5/1974 | Strezelewicz | 324/170 |
| 3,873,911 A | 3/1975 | Champlin | 324/430 |
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636 |
| 3,906,329 A | 9/1975 | Bader | 320/134 |
| 3,909,708 A | 9/1975 | Champlin | 324/431 |
| 3,936,744 A | 2/1976 | Perlmutter | 324/416 |
| 3,946,299 A | 3/1976 | Christianson et al. | 320/163 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |

(List continued on next page.)

OTHER PUBLICATIONS

"Electrochemical Impedance Spectroscopy in Battery Development and Testing", *Batteries International*, Apr. 1997, pp. 59 and 62–63.

(List continued on next page.)

*Primary Examiner*—Shawn Riley
*Assistant Examiner*—Lawrence Luk
(74) *Attorney, Agent, or Firm*—Westman, Champlin & Kelly, P.A.

(57) ABSTRACT

An electronic battery tester for testing a storage battery includes test circuitry configured to provide an output based upon a selected test criteria. Additionally, circuitry is provided to assist in balancing batteries used in a string of multiple batteries.

22 Claims, 3 Drawing Sheets

U.S. PATENT DOCUMENTS

| | | | |
|---|---|---|---|
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,070,624 A | 1/1978 | Taylor | 324/772 |
| 4,086,531 A | 4/1978 | Bernier | 324/772 |
| 4,112,351 A | 9/1978 | Back et al. | 324/380 |
| 4,114,083 A | 9/1978 | Benham et al. | 320/150 |
| 4,126,874 A | 11/1978 | Suzuki et al. | 324/429 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 364/483 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/384 |
| 4,514,694 A | 4/1985 | Finger | 324/429 |
| 4,520,353 A | 5/1985 | McAuliffe | 340/636 |
| 4,633,418 A | 12/1986 | Bishop | 364/554 |
| 4,659,977 A | 4/1987 | Kissel et al. | 320/150 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,697,134 A | 9/1987 | Burkum et al. | 320/134 |
| 4,707,795 A | 11/1987 | Alber et al. | 324/433 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/125 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. | 320/35 |
| 4,849,700 A | 7/1989 | Morioka et al. | 324/427 |
| 4,876,495 A | 10/1989 | Palanisamy et al. | 320/106 |
| 4,881,038 A | 11/1989 | Champlin | 324/426 |
| 4,912,416 A | 3/1990 | Champlin | 324/430 |
| 4,913,116 A | 4/1990 | Katogi et al. | 123/406.32 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/159 |
| 5,194,799 A | 3/1993 | Tomantschger | 320/2 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |
| 5,281,920 A | 1/1994 | Wurst | 324/430 |
| 5,295,078 A | 3/1994 | Stich et al. | 320/136 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,331,268 A | 7/1994 | Patino et al. | 320/160 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,365,160 A | 11/1994 | Leppo et al. | 320/160 |
| 5,365,453 A | 11/1994 | Startup et al. | 320/136 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,457,377 A | 10/1995 | Jonsson | 324/430 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 320/137 |
| 5,537,967 A | 7/1996 | Tashiro et al. | 123/192.1 |
| 5,546,317 A | 8/1996 | Andrieu | 324/427 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,572,136 A | 11/1996 | Champlin | 324/426 |
| 5,574,355 A | 11/1996 | McShane et al. | 320/161 |
| 5,583,416 A | 12/1996 | Klang | 320/160 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,621,298 A | 4/1997 | Harvey | 320/134 |

| | | | |
|---|---|---|---|
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/156 |
| 5,650,937 A | 7/1997 | Bounaga | 320/134 |
| 5,652,501 A | 7/1997 | McClure et al. | 320/134 |
| 5,563,659 A | 8/1997 | Kunibe et al. | 477/111 |
| 5,653,659 A | 8/1997 | Kunibe et al. | 477/111 |
| 5,656,920 A | 8/1997 | Cherng et al. | 320/161 |
| 5,675,234 A | 10/1997 | Greene | 324/430 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/116 |
| 5,717,336 A | 2/1998 | Basell et al. | 324/430 |
| 5,717,937 A | 2/1998 | Fritz | 320/128 |
| 5,739,667 A | 4/1998 | Matsuda et al. | 320/5 |
| 5,747,909 A | 5/1998 | Syverson et al. | 310/156 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/112 |
| 5,793,359 A | 8/1998 | Ushikubo | 345/169 |
| 5,808,469 A | 9/1998 | Kopera | 324/434 |
| 5,818,234 A | 10/1998 | McKinnon | 324/433 |
| 5,821,756 A * | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/160 |
| 5,895,440 A | 4/1999 | Proctor et al. | 702/63 |
| 5,914,605 A | 6/1999 | Bertness | 324/430 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A * | 4/2000 | Bertness | 324/426 |
| 6,072,299 A | 6/2000 | Kurie et al. | 320/112 |
| 6,072,300 A | 6/2000 | Tsuji | 320/116 |
| 6,081,098 A * | 6/2000 | Bertness et al. | 320/134 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,161,640 A | 12/2000 | Yamaguchi | 180/65 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 2/2001 | Amatucci et al. | 361/50 |
| 6,222,369 B1 | 4/2001 | Champlin | 324/430 |
| 6,225,808 B1 | 5/2001 | Varghese et al. | 324/426 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/195 |
| 6,347,958 B1 | 2/2002 | Tsai | 439/488 |
| 6,351,102 B1 | 2/2002 | Troy | 320/139 |
| 6,359,441 B1 | 3/2002 | Bertness | 324/426 |
| 6,363,303 B1 | 3/2002 | Bertness | 701/29 |
| 6,384,608 B1 | 5/2002 | Namaky | 701/29 |
| 6,388,448 B1 | 5/2002 | Cervas | 324/426 |
| 6,392,414 B2 | 5/2002 | Bertness | 324/429 |
| 6,411,098 B1 | 6/2002 | Laletin | 324/436 |
| 6,417,669 B1 | 7/2002 | Champlin | 324/426 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |

FOREIGN PATENT DOCUMENTS

| | | |
|---|---|---|
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| RU | 2089015 C1 | 8/1997 |
| WO | WO 93/22666 | 11/1993 |
| WO | WO 94/05069 | 3/1994 |
| WO | WO 98/58270 | 12/1998 |
| WO | WO 99/23738 | 5/1999 |

OTHER PUBLICATIONS

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT & T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standards Association UDC*, 621. 355. 2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

"Alligator Clips with Wire Penetrators" *J.S. Popper, Inc.* product information, downloaded from http://www.jspopper.com/, undated Mar. 22, 2002.

"#12: LM78S40 Simple Switcher DC to DC Converter", *ITM e–Catalog*, downloaded from http://www.pcbcafe.com, undated Feb. 9, 1990.

"Simple DC–DC Converts Allows Use of Single Battery", *Electronix Express*, downloaded from http://www.elexp.com/t_dc–dc.htm, undated Nov. 10, 1998.

"DC–DC Converter Basics", *Power Designers*, downloaded from http://www.powederdesigners.com/InforWeb.design_center/articles/DC–DC/converter.shtm, undated 1998.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB–071, 1994.

National Semiconductor Corporation, "LMF90–$4^{th}$ –Order Elliptic Notch Filter", 12/94, RRD–B30M115, Dec. 1994.

* cited by examiner

ELECTRONIC BATTERY TESTER

The present invention claims priority to Provisional Application Serial No. 60/163,013, filed Nov. 1, 1999 and entitled AUTOMOTIVE BATTERY CHARGING SYSTEM TESTER.

BACKGROUND OF THE INVENTION

The present invention relates to storage batteries. More specifically, the present invention relates to a battery system tester for testing storage batteries.

Many attempts have been made to test storage batteries. One technique which has been pioneered by Dr. Keith S. Champlin and Midtronics, Inc. of Burr Ridge, Ill. relates to measuring the conductance of batteries to determine their condition. This technique is described in a number of United States patents, for example, U.S. Pat. Nos. U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; and U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY.

With the advent of accurate battery testing, it has become apparent that in some instances the battery testing technique may not be appropriate for the particular purpose of the battery or configuration of multiple batteries.

SUMMARY OF THE INVENTION

An electronic battery tester for testing a storage battery, includes a dynamic measurement circuit configured to measure at least one dynamic parameter of the battery. A memory is configured to store a plurality of test criteria and an input is configured to receive input data related to a selected test criteria. A test circuit provides an output related to battery condition as a function of the dynamic parameter an the selected test criteria. In another aspect, a memory is configured to store a first dynamic parameter from the measurement circuitry related to a first battery of a battery pack. Balance circuitry provides an in-balance output if a second battery in the pack has a dynamic parameter which is substantially equal to the first dynamic parameter.

DETAILED DESCRIPTION OF THE PREFERRED EMBODIMENTS

Figure 1:
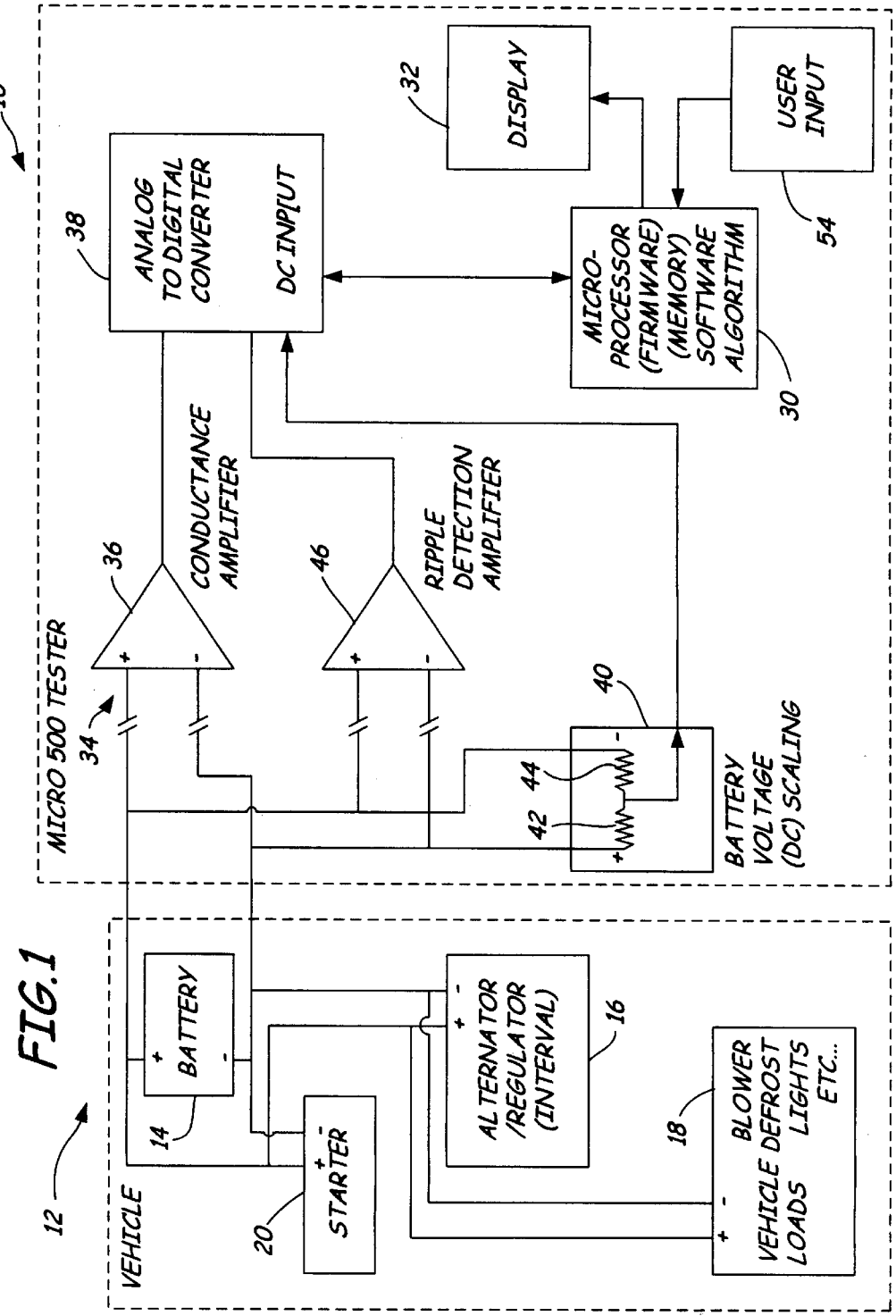
FIG. 1 is a simplified block diagram of a battery tester in accordance with the present invention.

FIG. 1 is a simplified block diagram of a battery tester 10 in accordance with one embodiment of the present invention coupled to a vehicle 12. Vehicle 12 includes a battery 14 having positive and negative terminals, an alternator with internal regulator 16, various vehicle loads 18, and a starter motor 20. In operation, battery 14 provides power to starter 20 and vehicle loads 18 when the engine in vehicle 12 is not running. When the engine in vehicle 12 is running, alternator 16 is used to power vehicle loads 18 and provide a charging current to battery 14 to maintain the charge of battery 14.

Charging system tester 10 includes a microprocessor 30 which controls operation of tester 10 and provides instructions and test result information to an operator through, for example, a display 32. Tester 10 includes a battery testing section 34 which is illustrated generally as conductance amplifier 36. Section 34 operates in accordance with, for example, the conductance based battery testing techniques described in Champlin patents U.S. Pat. Nos. U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,598,098, issued Jan. 28, 1997, entitled ELECTRONIC BATTERY TESTER WITH VERY HIGH NOISE IMMUNITY; U.S. Pat. No. 5,821,756, issued Oct. 13, 1998, entitled ELECTRONIC BATTERY TESTER WITH TAILORED COMPENSATION FOR LOW STATE-OF-CHARGE. Section 34 is illustrated in very simplified form and conductance amplifier 36 provides an output to an analog to digital converter 38 which is related to the internal conductance of battery 14.

A DC voltage sensor 40 includes voltage scaling resistors 42 and 44 and is coupled to battery 14 to provide an output to analog to digital converter 38 which is representative of the DC voltage across battery 14. Further, an AC ripple detector amplifier 46 is coupled to battery 14 through capacitors 48 and 50 and provides an output to analog to digital converter 38 which is representative of the AC ripple voltage across battery 14.

Microprocessor 30 controls analog to digital converter 38 to select which of the three inputs to digitize. Microprocessor 30 includes firmware, memory, and a software program in accordance with the invention. The user input 54 is coupled to microprocessor 30 to provide the information to microprocessor 30 from an operator.

Preferably, tester 10 is portable such that it may be easily moved between vehicles or otherwise transported. Portability of tester 10 is achieved because tester 10 does not require large internal carbon pile loads to load the battery charging system. Instead, as described herein, tester 10 utilizes loads internal to the vehicle 12 in testing the charging system. Further, the battery tester performed by tester 10 is in accordance with the non-load battery testing technique as described above.

In another aspect of the present invention, microprocessor 30 includes a memory which is capable of storing a number of different decision making algorithms or test criteria. The particular test criteria or algorithm can be selected through user input 54. For example, in one aspect, the test criteria is selected based upon the particular type of battery or rated reserve capacity of the battery. For example, if a battery is rated as having a particularly robust design with a large reserve capacity, the test criteria can be made more stringent such that an indication that the battery is "good" is only provided if the battery meets the higher test criteria.

Figure 2:
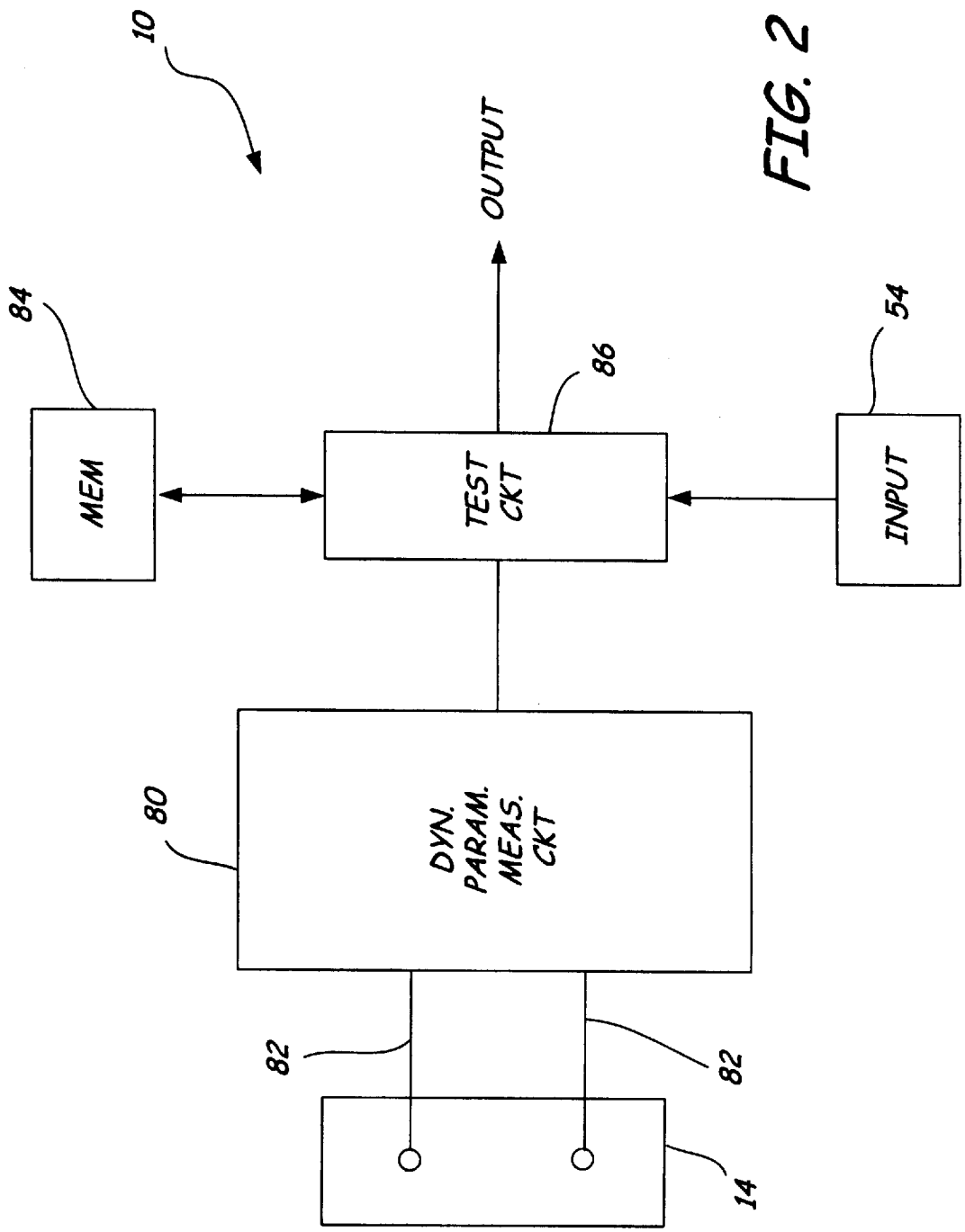
FIG. 2 is a simplified diagram illustrating a tester in accordance with the present invention.

FIG. 2 is a simplified block diagram of tester 10 in accordance with such an embodiment. In FIG. 2, tester 10 includes dynamic parameter measurement circuitry 80 which couples to battery 14 through Kelvin connections 82. Dynamic parameter measurement circuitry 80 can be any circuit configuration which measures a dynamic parameter of battery 14. As used herein, a dynamic parameter is one which is related to a signal having an AC component. The signal can be either applied directly or drawn from battery 14. Example dynamic parameters include dynamic resistance, conductance, impedance, admittance, etc. This list is not exhaustive, for example, a dynamic parameter can include a component value of an equivalent circuit of battery 14. Memory 84 is configured to store a plurality of different test criteria. For example, the test criteria can be a number of different thresholds or errors which are used to provide an indication as to whether the battery 14 is "good." Input 54, which can comprise a user input, is coupled to test circuitry 86. Test circuitry 86 applies a selected test criteria for memory 84 based upon user input 54 to the dynamic parameter measured by dynamic parameter measurement circuitry 80. Based upon this comparison, an output is provided. FIG. 2 is a very simplified block diagram and in actual practice a number of the individual elements can be implemented in a single microprocessor and other circuit configurations. Input 64 can be any type of input and is not limited to a user input.

In this aspect of the invention, the criteria used to test battery 14 can be adjusted based upon a particular aspect of battery 14. For example, if battery 14 is a new battery, a more stringent test can be applied to battery 14. Additionally, if battery 14 is intended to be used in an industrial vehicle or other situation which is very demanding of a battery, a more "difficult" or stringent test criteria can be provided. The test criteria can be based upon other factors to the dynamic parameter such as temperature or "static" parameters. The input from input 54 can be any type of input data and does not need to be user generated. Example input data includes every make, model, type, construction date, present date, temperature, vehicle type, VIN code, battery service requirements, requirements for a particular application, etc.

Tester 10 can test a battery which is formed by more than one individual battery. This is called a "battery pack". For example, some vehicles such as large industrial vehicles include multiple batteries which are connected in series, parallel or series-parallel. In such an embodiment, element 14 in FIGS. 1 and 2 can represent such a pack such batteries can be particularly difficult to test and, in many prior art battery testers, have required the batteries to be disconnected and individually tested. In accordance with one aspect of the present invention, microprocessor 30 tests the multiple batteries using a variety of appropriate techniques. Microprocessor 30 is capable of determining the configuration of the batteries (parallel, series or series-parallel) by measuring the voltage at the terminals of the "battery pack" and through receiving user input through input 54 indicating the number of batteries in the pack. Additionally, in some instances microprocessor 30 may also need to receive information related to the voltage of the individual batteries in the pack in order to make a determination as to the configuration of the pack. There are some instances where the configuration of the pack cannot be determined by simply knowing the voltage of individual batteries and taking measurements. A series of standard known configurations can be stored in the memory in tester 10 tester, and a user can select one such configuration. Configurations of battery packs include up to 12 batteries in parallel, three batteries in series and 12 batteries in series-parallel configurations. Microprocessor 30 is capable of determining the CCA rating and/or conductance of the entire battery pack using the information it has determined regarding the configuration of the battery pack. For example, in parallel configurations the CCA measurement is additive as is conductance, while in series-parallel or series configurations the voltage can be additive but the CCA/conductance can remain the same.

In one aspect, tester 10 is capable of detecting a good battery, a discharged battery, a bad cell, a bad battery, a marginal and/or defective wiring within a battery pack without disconnecting the pack. In one such embodiment, multiple test connections are used to connect to the battery pack. For example, one pair of connections can be used to connect to either end of the battery pack while another connection can be used to connect to points within the battery pack or to measure current flowing between points within the battery pack. Using this technique, the various currents flowing within the battery pack can be determined and this information can be used to detect a bad connection, such as a bad cable or poor physical connection between two points within the battery pack. Additionally, microprocessor 30 can instruct the user using display 32 to make various measurements at various points along the battery pack to more fully determine the condition of various portions of the battery pack.

In some instances, the microprocessor 30 can instruct the user to disconnect a certain battery within the battery pack in order to perform an isolated test on that battery.

In another aspect, microprocessor 30 uses advanced testing criteria or testing techniques such as fuzzy logic, neural networks or other artificial intelligence techniques to detect and make decisions regarding the health of a battery or a battery pack. Such techniques can also be used in evaluating time varying signals such as signals generated by the operation of alternator 16 or starter 20 in vehicle 12.

In another aspect, tester 10 includes a load such that a traditional load test can be performed on the battery 14. Such a load test is known in the art and is performed by applying a load to a battery and observing the effect of the applied load to the voltage or current flowing from the battery. In such an embodiment, such information can be used in conjunction with a resistance, impedance, conductance or admittance test of the battery 14 to identify a defect in the battery or otherwise determine the condition of the battery. This technique can also be used to measure the remaining or reserve capacity of the battery or battery pack. Such a testing technique provides additional information to microprocessor 30 which can then be used to make more advanced decisions regarding battery condition.

Microprocessor 30 can also compute, store, display or print out equivalent rating information regarding equivalent ratings of battery 14. Such equivalent ratings include CCA, SAE, DIN, IEC, EN, CA, MCA, JIS or others of the battery. In such an embodiment, microprocessor 30 can adjust for variations in the measured conductance of a battery pack due to cables between batteries in the pack or the connectors between the cables and the battery which can insert series resistances into the measurement. The adjustment can be based upon compensation data stored in a memory which is determined empirically by measuring different types of batteries or through other techniques. Particular compensation information can be determined through determining the configuration of batteries within a battery pack as described above. The compensation information can in the form of a multiplier which is used to multiply a conductance measurement.

Figure 3:
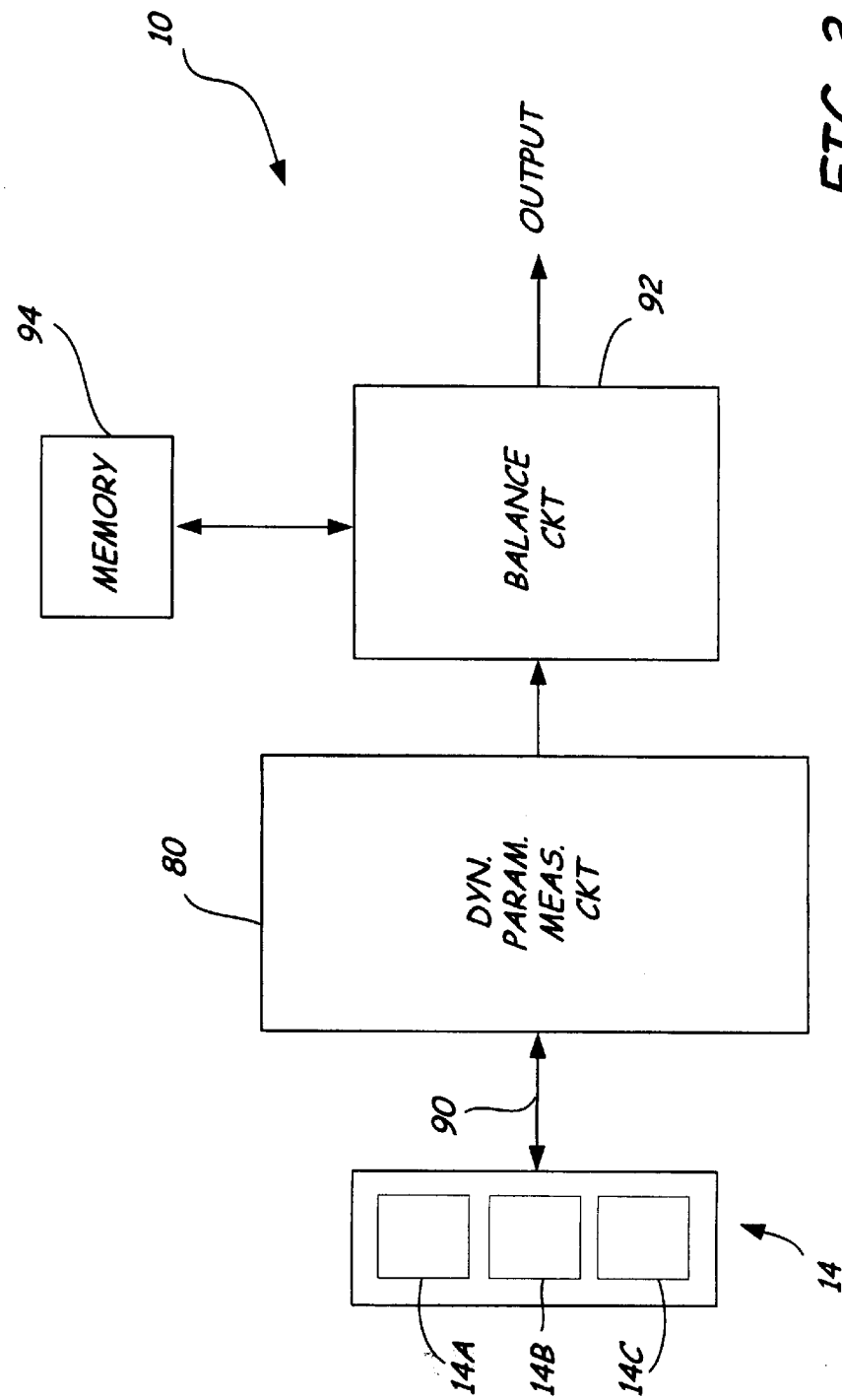
FIG. 3 is a simplified diagram illustrating a tester in accordance with the present invention.

In another aspect, measurements of battery conductance are used to "balance" the various batteries in a battery pack such that they are selected and arranged for delivering optimized current and/or receiving optimized charge current. This aspect is illustrated in FIG. 3. For example, if a 600 CCA battery is placed in series with a 500 CCA battery, one of the batteries will tend to become overcharged while the other battery will tend to be undercharged. Tester 10 can alert an operator regarding the unbalanced condition of the batteries within the pack. Tester 10 can prompt a user to disconnect certain batteries within the pack and perform individual tests on the batteries to determine which battery is unbalanced from the others. This will also assist in selecting the batteries used in the battery pack.

FIG. 3 illustrates a simplified diagram of this aspect of tester 10 and includes a dynamic parameter measurement circuit 80 coupled to battery 14 through connection 90. Battery 14 is illustrated as multiple batteries, in this case three separate batteries 14A, 14B and 14C. These batteries can be connected in series, parallel or series parallel. Connection 90 can be a single pair of Kelvin connectors which are selectively positioned between or on various batteries in pack 14. There can be more than two Kelvin connections which are coupled to pack 14. Memory 94 stores a first dynamic parameter from dynamic parameter measurement circuit 80 related to a dynamic parameter of at least one battery 14A, 14B or 14C within battery pack 14. Balance circuit 92 provides an in-balance output if a second dynamic parameter of a second battery or batteries within pack 14 is "substantially equal" to the dynamic parameter stored in memory 94. As used in this context, the term "substantially equal" means that the two dynamic parameters are within a predetermined or adjustable percentage or fixed amount from one another. If the two dynamic parameters are measured simultaneously, memory 94 is not required to store a dynamic parameter. In a further embodiment of this a aspect of the invention, a static parameter such as voltage is used in determining if the batteries are within balance. For example, the two batteries are within 0.1 volts of each other (i.e., 12.5 and 12.6 volts) and the conductance within 10%, an in-balance indication is provided. In another example, less than a 0.05 volt difference is required in addition to the dynamic parameter requirement. Additionally, data from multiple batteries can be stored in memory 94 and a preferred configuration of the batteries can be provided by balance circuitry 92 on its output. Information regarding the configuration of battery pack 14 can be received through the input 54 shown in FIGS. 1 and 2 and the output from balance circuit 92 adjusted accordingly.

The condition of cables or connectors can be determined by applying a large load, such as through an internal load in battery tester 10 or through application of a vehicle load 18, or through the application of a large resistance, for example more than about 0.1 ohms. An amp clamp measurement can also be used. Further, microprocessor 30 can prompt a user to measure voltage drops across various cables in the pack and make a decision (i.e., good/bad) regarding a cable or connection in the battery pack. Microprocessor 30 can store, display, print and manage multiple test results associated with the multiple test measurements made when measuring a number of batteries which make a battery pack. This can be partial measurement, parameter, or other items related to individual batteries within the pack.

In one aspect, battery tester 10 is configured to determine the CCA rating of a battery or battery pack having a relatively large CCA value, for example, up to 5000 CCA. In such an embodiment, sensitive amplifiers and/or relatively large current values can be used to obtain the CCA or conductance measurement. In another aspect, tester 10 can perform a test on vehicle 12 by instructing an operator to apply a load (i.e., head lights, blower, etc.) or a combination of loads and reserve the response from battery 14. This information can be used to determine diagnostic information regarding battery 14 out of the operation of components within vehicle 12.

With one aspect of the invention, the tester can be used to test the "straps" that are used to couple individual batteries together to form a battery pack. For example, a dynamic parameter can be measured with the Kelvin probes applied directly to the battery. A second dynamic parameter can be measured in which one of the straps separates a Kelvin probe from the battery. A microprocessor can then compute the dynamic parameter of the strap alone and provide an output if the strap is poor. For example, if the strap dynamic conductance is too low, a warning can be provided. This technique can be extended to test multiple straps. In addition to testing straps within the pack, this technique can also be used to test cables that connect to the battery. Dynamic parameters can be stored in the memory for use in subsequent computations, or multiple Kelvin probes can be used to simultaneously measure multiple dynamic parameters.

In some aspects, a separate current probe can be used, such as a shunt, amp clamp or Hall effect sensor, to measure the current flowing into or out of a battery or group of batteries under test. This data can be paired with voltage measurements to obtain static or dynamic parameters.

The tester can store measurements in memory such that the battery pack can be ranked in terms of performance.

Although the present invention has been described with reference to preferred embodiments, workers skilled in the art will recognize that changes may be made in form and detail without departing from the spirit and scope of the invention.

What is claimed is:

1. An electronic battery tester for use in configuring a plurality of storage batteries in a battery pack, comprising:
    a dynamic measurement circuit configured to measure a first dynamic parameter of a first storage battery;
    a memory configured to store a second dynamic parameter from related to a second battery of the battery pack;
    balance circuitry configured to provide an in-balance output if the second battery in the pack has a second dynamic parameter which is substantially equal to the first dynamic parameter.

2. The electronic battery tester of claim 1 wherein the dynamic parameters comprise conductance.

3. The electronic battery tester of claim 1 wherein the balance circuitry provides the in-balance output as a further function of a first voltage measured across the first storage battery and a second voltage stored in the memory measured across the second storage battery.

4. The electronic battery tester of claim 3 wherein the balance circuitry provides the in-balance output if the first and second voltages are within 0.1 volts of each other.

5. The electronic battery tester of claim 3 wherein the balance circuitry provides the in-balance output if the first and second voltages are within 0.05 volts of each other.

6. The electronic battery tester of claim 1 wherein the in-balance circuitry provides the in-balance output if the first and second dynamic parameters are within 10%.

7. The electronic battery tester of claim 1 including an input configured to receive configuration information related to a configuration of the battery pack and wherein the in-balance output is further a function of the configuration information.

8. The electronic battery tester of claim 7 wherein the input comprises a user input.

9. A method of testing a storage battery, comprising:
    performing a dynamic measurement on the storage batter to obtain a dynamic parameter of the battery;
    receiving an input related to a selected test criteria;
    retrieving a stored test criteria in response to the received selected test criteria from a memory;
    evaluating the storage battery as a function of the measured dynamic parameter and the retrieved test criteria; and
    wherein receiving an input comprises receiving a user input.

10. The method of claim 9 wherein the dynamic parameter comprises conductance.

11. The method of claim 9 wherein evaluating comprises comparing.

12. The method of claim 9 wherein the test criteria is related to battery purpose.

13. The method of claim 9 wherein the test criteria is related to battery age.

14. The method of claim 9 wherein the storage battery is for use in a vehicle type and the test criteria is related to the vehicle type.

15. The method of claim 9 wherein the input comprises a VIN code for a vehicle.

16. A method in an electronic battery tester of configuring a plurality of storage batteries in a battery pack, comprising:
    measuring a first dynamic parameter of a first battery in the pack;
    storing the first parameter in a memory;
    measuring a second dynamic parameter of a second battery in the pack;
    retrieving the first dynamic parameter from the memory;
    comparing the first dynamic parameter to the second dynamic parameter; and
    providing an in-balance output of the first dynamic parameter is substantially equal to the second dynamic parameter.

17. The method of claim 16 wherein the dynamic parameters comprise conductance.

18. The method of claim 16 wherein the in-balance output is further a function of a first voltage measured across the first storage battery and a second voltage stored in the memory measured across the second storage battery.

19. The method of claim 18 wherein the in-balance output is provided if the first and second voltages are within 0.1 volts of each other.

20. The method of claim 18 wherein the in-balance output is provided if the first and second voltages are within 0.05 volts of each other.

21. The method of claim 16 wherein the in-balance output is provided if the first and second dynamic parameters are within 10%.

22. The method of claim 16 including receiving configuration information related to a configuration of the battery pack and wherein the in-balance output is further a function of the configuration information.

* * * * *

UNITED STATES PATENT AND TRADEMARK OFFICE
CERTIFICATE OF CORRECTION

PATENT NO. : 6,566,883 B1
DATED : May 20, 2003
INVENTOR(S) : J. David Vonderhaar et al.

It is certified that error appears in the above-identified patent and that said Letters Patent is hereby corrected as shown below:

<u>Title page,</u>
Item [56], References Cited, U.S. PATENT DOCUMENTS, insert
-- 5,711,648    1/1998        Hammerslag        414/786
   5,927,938    7/1999        Hammerslag        414/809
   5,951,229    9/1999        Hammerslag        414/398
   5,961,561    10/1999       Wakefield, II     701/29
   5,961,604    10/1999       Anderson et al.   709/229
   6,236,332    5/2001        Conkright et al.  340/825.06 --

<u>Column 8,</u>
Line 9, change "batter" to -- battery --.

Signed and Sealed this

Eighth Day of June, 2004

JON W. DUDAS
*Acting Director of the United States Patent and Trademark Office*